(12) United States Patent
Sarigiannis et al.

(10) Patent No.: US 6,844,260 B2
(45) Date of Patent: Jan. 18, 2005

(54) INSITU POST ATOMIC LAYER DEPOSITION DESTRUCTION OF ACTIVE SPECIES

(75) Inventors: Demetrius Sarigiannis, Boise, ID (US); Shuang Meng, Boise, ID (US); Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/356,981

(22) Filed: Jan. 30, 2003

(65) Prior Publication Data

US 2004/0152304 A1 Aug. 5, 2004

(51) Int. Cl.[7] .............................................. H01L 21/44
(52) U.S. Cl. ...................... 438/680; 438/681; 438/762; 438/765; 438/768; 438/769; 438/778; 438/903; 438/905; 438/913; 438/935
(58) Field of Search .............................. 438/680–681, 438/762, 765, 768–769, 778, 903, 905, 913, 935

(56) References Cited

U.S. PATENT DOCUMENTS

| | | | |
|---|---|---|---|
| 6,015,590 A | 1/2000 | Suntola et al. | 427/255.23 |
| 6,042,652 A | 3/2000 | Hyun et al. | 118/719 |
| 6,143,659 A | 11/2000 | Leem | 438/688 |
| 6,174,377 B1 | 1/2001 | Doering et al. | 118/729 |
| 6,174,809 B1 | 1/2001 | Kang et al. | 438/682 |
| 6,305,314 B1 * | 10/2001 | Sneh et al. | 118/723 R |
| 6,506,352 B1 * | 1/2003 | Lindfors et al. | 423/240 S |
| 2002/0187084 A1 * | 12/2002 | Lindfors et al. | 422/177 |
| 2003/0082296 A1 * | 5/2003 | Elers et al. | 427/96 |
| 2003/0180458 A1 * | 9/2003 | Sneh | 427/248.1 |

OTHER PUBLICATIONS www.ice–equipment.com/html/supplier—pillar.html, (last visited Apr. 23, 2003).
http://www.pacificozone.com/catalog/iocs.htm, (last visited Apr. 23, 2003).

* cited by examiner

Primary Examiner—Lynne A. Gurley
(74) Attorney, Agent, or Firm—Fish & Neave LLP; Jared Kneitel (57) ABSTRACT

Systems and methods for insitu post atomic layer deposition (ALD) destruction of active species are provided. ALD processes deposit multiple atomic layers on a substrate. Pre-cursor gases typically enter a reactor and react with the substrate resulting in a monolayer of atoms. After the remaining gas is purged from the reactor, a second pre-cursor gas enters the reactor and the process is repeated. The active species of some pre-cursor gases do not readily purge from the reactor, thus increasing purge time and decreasing throughput. A high-temperature surface placed in the reactor downstream from the substrate substantially destroys the active species insitu. Substantially destroying the active species allows the reactor to be readily purged, increasing throughput.

21 Claims, 7 Drawing Sheets

INSITU POST ATOMIC LAYER DEPOSITION DESTRUCTION OF ACTIVE SPECIES

BACKGROUND OF THE INVENTION

This invention relates to systems and methods that destroy active species of pre-cursor gases used in atomic layer deposition (ALD). More particularly, this invention relates to systems and methods that destroy active species of pre-cursor gases inside the reactor in which the ALD occurs.

ALD is a process in which atoms are deposited on a substrate, monolayer at a time, to grow a multi-layered thin film. In typical ALD processes, a first pre-cursor gas enters a reactor in which a substrate is placed. The first pre-cursor gas saturates the surface of the substrate forming a first monolayer. The reactor is then typically purged with an inert gas. Purging is required to prevent parasitic chemical vapor deposition (CVD) reactions from occurring between the first pre-cursor gas and a second pre-cursor gas that enters the chamber after purging. If most of the pre-cursor gas is not purged from the chamber, these reactions can form particles that will either ruin the thin film being grown, result in an undesired CVD-type deposition, or both. Problems associated with CVD-type deposition include poor step coverage and poor uniformity.

After the first pre-cursor gas is purged, a second pre-cursor gas enters the reactor and reacts with the adsorbed monolayer or partial monolayer (i.e., the first monolayer) to form a monolayer of the desired film. The reactor is again purged with an inert gas. This process is repeated until the thin film is grown to a desired thickness.

In some ALD reactions, one of the pre-cursors may include an active species. An active species is a molecule that is not in its most stable state. Active species will readily react to either accept or donate electrons in a reaction (e.g., $O_3$, $O^*$, or $N^*$ (where * denotes an excited state with excess energy)). Because most active species readily decay or recombine into a more stable state as temperature increases, they have a relatively short half-life in an ALD chamber operating at temperatures in excess of 400° C. However, in some cases, it may be advantageous to grow a film via ALD at lower temperatures such as 200° C. In this situation, the half-life of the active species is increased, and for a given purge time, there is a higher initial concentration of active species present to be purged from the reactor. This directly reduces the throughput of the reactor.

Variables that can affect the half-life of active species of gases include temperature and pressure. As temperature and pressure increase, the half-life of the active species decreases because of simple kinetics. Destruction of the active species is necessary because of their high reactivity. For example, an active species such as ozone can irritate the eyes and lungs, and so should be completely converted into $O_2$ before being discharged to the atmosphere. ALD processes that require the use of an active species typically run at temperatures high enough to destroy (e.g., consume or decompose) most of the active species before they leave the chamber. This reduces the concentration level of the active species significantly.

However, current experience with ALD processes indicates that it may be advantageous to operate at temperatures lower than the high temperatures of many known ALD processes. For example, many of the metal-organic pre-cursors that may be used in the ALD of hafnium (Hf) oxide decompose at temperatures higher than 200° C. Therefore, in order to obtain a film with acceptable properties (e.g., step coverage, low carbon content) the reactor must be operated at a temperature close to or lower than 200° C. When ozone is used as an oxidizer in this process, these lower temperatures are not sufficient to decompose all of the ozone before it leaves the reactor.

For example, in the ALD of hafnium oxide, if ozone is supplied to a reactor and the chamber is running at 400° C., a certain percentage of the ozone, X, will be consumed by the reaction with the Hf pre-cursor and another percentage, Y, will be consumed by kinetic recombination of the $O_3$ and $O^*$ to form $O_2$. This kinetic recombination reaction is driven by temperature. The overall percentage of ozone remaining in the chamber will be Z. However, if the chamber is running at 200° C., the percentage of ozone that recombines will be far less than Y. Thus, the amount remaining to be purged will be greater than Z. This requires a longer purge time.

In view of the foregoing, it would be desirable to decrease the purge time of active species of pre-cursor gases from reactors used in ALD to improve throughput.

SUMMARY OF THE INVENTION

It is an object of this invention to decrease the purge time of active species of pre-cursor gases from reactors used in ALD to improve throughput.

Some active species of pre-cursor gases that do not readily decay at typical ALD reaction temperatures are known to readily decay at temperatures higher than the ALD reaction temperatures. For example, when aluminum oxide is deposited using trimethylaluminum (TMA) and ozone (ozone includes $O_3$, $O_2$, and $O^*$), the active species of the ozone (i.e., $O_3$ and $O^*$) do not readily decay at the typical reaction temperature of about 300° C. That is, a large percentage of the active species remains active. In other words, a large concentration of the active species remains in the reactor. This hinders the throughput of the reactor. However, at higher temperatures (e.g., at temperatures equal to or greater than 400° C.) the active species of the ozone readily break down.

There are three ways to decrease the concentration of an active species in the reactor: i) consume more $O_3$ in the surface reaction to grow film (in ALD this is limited because only one monolayer is grown at a time); ii) increase the temperature to destroy more active species via a kinetic recombination reaction; iii) purge for a longer time. The addition of a high temperature surface beyond the wafer but before the outlet will destroy more active species. This will drop the concentration of the active species to one that can be reduced more readily with a shorter purge time.

In accordance with this invention, a high-temperature surface is placed inside the reactor to significantly speed the decay of the active species and thus increase the throughput of the reactor. The high-temperature surface preferably has a high surface area. The high-temperature surface is preferably a metal, other material, or combination thereof that can be heated to a temperature high enough to induce the rapid decay of the active species of a pre-cursor gas used in ALD. The high-temperature surface may also include a material that catalyzes the active species to further increase the rate of decay. Alternatively, the surface may be coated with a catalyst. In the case of ozone as an active species, the high-temperature surface is preferably heatable to about 400° C. or higher.

The high-temperature surface is preferably placed inside the reactor downstream (with respect to the flow of gas) from the gas input and the substrate and upstream from the gas output. The high-temperature surface is preferably placed inside the reactor such that the temperature of the substrate is not substantially affected by the high-temperature surface. As the active species of a pre-cursor gas are purged, they are "de-activated" (i.e., destroyed) as they pass over the high-temperature surface.

Advantageously, more than one high-temperature surface may be placed inside the reactor according to the invention. In addition, the high-temperature surface or surfaces can be of various shapes. For example, the surface or surfaces may be a group of fins, a ring, a perforated plate, an ordered mesh of metal or other material, or a random mesh of metal or other material. The high-temperature surface is preferably shaped and situated inside the reactor such that the flow of gas through the reactor is not substantially impeded.

Advantageously, thin films may be grown on multiple substrates simultaneously according to the invention.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Atomic layer deposition (ALD) processes are used to grow multi-layered thin films for use in a variety of semiconductor fabrication applications. Such applications include DRAMs, $SiO_2$ dielectrics, and gate dielectrics. In typical ALD processes, pre-cursor gases enter a reactor one at a time via one or more gas inputs. Pre-cursor gases used in ALD are often chosen for their self-regulation properties with respect to growth. In some ALD systems, one of the pre-cursors is or includes an active species. For example, in a system to grow aluminum oxide, pre-cursors of trimethylaluminum (TMA) and ozone (ozone includes $O_3$, $O_2$, and O*) are alternately entered into a chamber. Ozone includes the active species $O_3$ and O*.

When a pre-cursor gas reacts with a substrate inside the reactor, a portion of the pre-cursor gas saturates the substrate forming a monolayer of atoms on the substrate. After the pre-cursor gas reacts with the substrate, the pre-cursor and active species (if any) are purged out of the reactor. This is done by either pulling a vacuum on one or more gas outputs of the reactor, forcing an inert gas (e.g., argon) through the reactor, or both.

After the first monolayer is deposited and the first pre-cursor purged, a second pre-cursor gas enters the reactor. This second pre-cursor reacts with the deposited portion of the first pre-cursor gas (i.e., grows on top of the deposited portion of the first pre-cursor gas). The remaining pre-cursor gas and active species (if any) of the second pre-cursor gas are then purged from the reactor. This process is repeated until the film is grown to the desired thickness.

Figure 1:
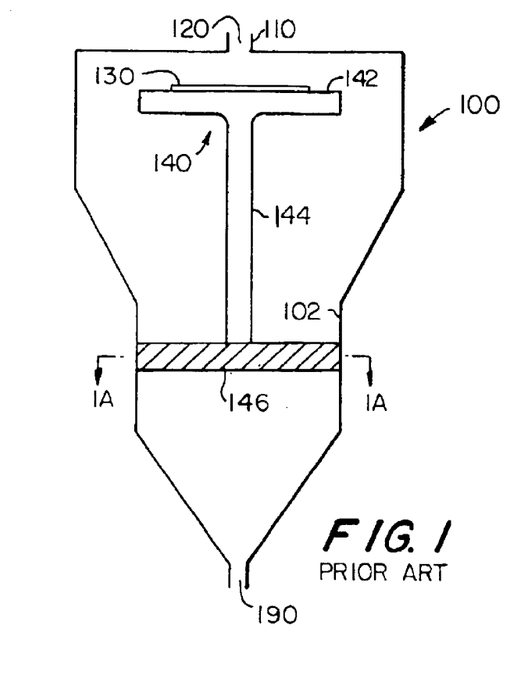
FIG. 1 illustrates a cross-section of a known reactor used in atomic layer deposition.

FIG. 1 illustrates a cross-section of a typical reactor for ALD. Gases enter reactor 100 via a gas input 120, which is coupled to a gas line 110. Gas line 110 may be connected to one or more gas sources (not shown). Gas selectively enters reactor 100 by opening or closing valves (not shown) in gas line 110. Gases exit reactor 100 via gas output 190.

Inside reactor 100 is one or more heaters 140. Heater 140 is supported by heater column 144 and heater support 146. Substrate 130 rests on and is substantially flush with surface 142 of heater 140. Surface 142 should be heated to a temperature suitable for the ALD of the film being grown. That is, surface 142 should be at a temperature that causes a pre-cursor gas to react with the substrate. Substrate 130 may rest on surface 142 simply due to gravity or be held under a vacuum or by mechanical means, or any combination thereof. The surface of substrate 130 with which the pre-cursor gases react does not have to face upward or towards the gas input (however, it should not face down on surface 142). Alternatively, substrate 130 can be placed near heater 140, instead of on it.

Surface 142 is preferably larger in both length and width than the largest substrate to be placed on surface 142. Surface 142 and heater column 144 are preferably cylindrical. This allows gas to pass over substrate 130 and through reactor 100 more rapidly as compared to surfaces and columns of other shapes. However, surface 142 and heater column 144 can still be of other shapes such as square, hexagonal, or octagonal.

Figure 1A:
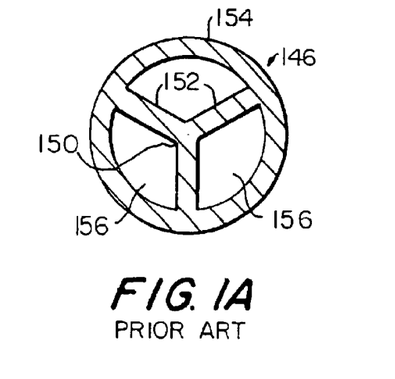
FIG. 1A illustrates a plan view of a heater support used in the reactor of FIG. 1 taken through line 1A—1A of FIG. 1.

FIG. 1A illustrates a plan view of heater support 146. At the center of support 146 is a base 150 on which column 144 rests. Extending radially outward from base 150 are several arms 152 that extend to ring 154. As shown, heater support 146 has several openings 156 to allow gas to pass through. Only one arm may be required to support base 150. Ring 154 may be connected to, or be a part of, reactor wall 102.

When growing ALD films, pre-cursor gases and their active species should be purged from the reactor as quickly as possible after the pre-cursor gases react with the substrate. When mass producing ALD films, purge time becomes an important factor in the number of films that can be produced in a given time.

Purging of active species may be difficult when they do not quickly decay into non-active species. This decreases the throughput of the reactor and the overall ALD process time. Non-active species are more readily purgeable because they are more stable and less reactive than active species.

To decrease the purge time of active species used in ALD, which are often temperature sensitive, a high-temperature surface is placed in the reactor in accordance with the invention. The high-temperature surface decreases the half-life of the active species and thus decreases purge time. For ALD reactions using, for example, trimethylaluminum (TMA) and ozone as the pre-cursor gases, the active species of ozone ($O_3$ and $O^*$) usually limit how fast the ALD reactions can be completed. At 250° C. (and 1 Torr) the half-life of ozone is about 76 seconds. The half-life drops to about 0.75 seconds at 400° C. (and 1 Torr), and to about 0.02 seconds at 600° C. (and 1 Torr).

The high-temperature surface is preferably positioned inside the reactor such that the pre-cursor gases react with the substrate before coming in the vicinity of, or in contact with, the high-temperature surface. In other words, the high-temperature surface is preferably downstream from the heater surface and substrate and upstream from the gas output. As the active species of a pre-cursor gas are purged, they are de-activated or "destroyed" (i.e., their reactivity is destroyed) as they pass over the high-temperature surface.

Figure 2:
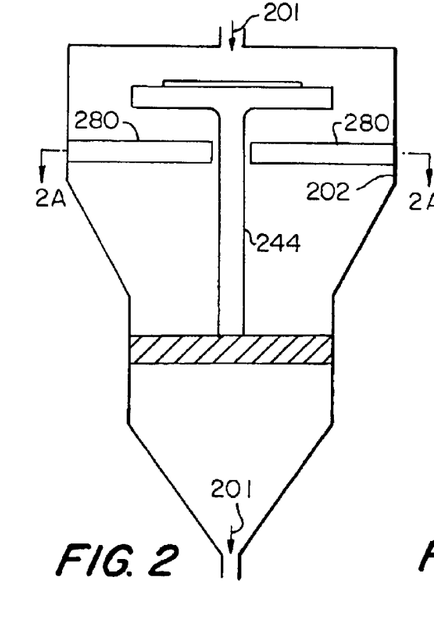
FIG. 2 illustrates a cross-section of a reactor with a first embodiment of a high-temperature surface therein according to the invention.

FIG. 2 illustrates a cross-section of a reactor 200 with several high-temperature surfaces 280 therein according to the invention. High-temperature surfaces 280 are "fins" that protrude from inner wall 202 of reactor 200. Fins 280 may be made of any suitable material or materials that can be heated to a temperature high enough to destroy (i.e., induce the rapid decay of) the active species of pre-cursor gases used in ALD processes. Fins 280 also may include (e.g., be coated with) a material that catalyzes the destruction of the active species. For example, in the case of ozone, fins 280 may include MnO, $MnO_2$, or CuO. Arrows 201 illustrate the flow of gas through reactor 200.

Figure 2A:
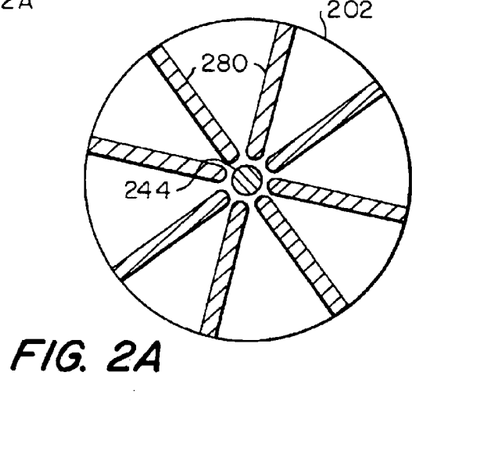
FIG. 2A illustrates a plan view of the high-temperature surface of FIG. 2 taken through line 2A—2A of FIG. 2.

FIG. 2A illustrates fins 280 extending radially outward from inner wall 202. Fins 280 are preferably not in contact with heater column 244 and may be any suitable shape that does not substantially impede gas flow. For example, the width (along the surface of wall 202) of fins 280 may be substantially smaller than their length (i.e., the portion that extends outward from wall 202). Fins 280 may also be arranged in any suitable way that does not substantially impede gas flow. For example, fins 280 may be pitched. In other words, fins 280 may be situated at angles similar to fan blades.

Figure 3:
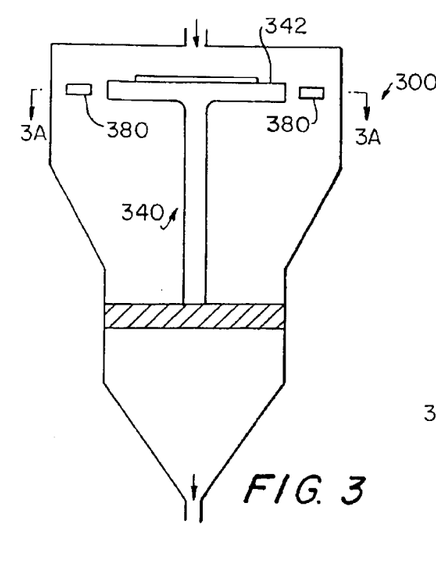
FIG. 3 illustrates a cross-section of a reactor with a second embodiment of a high-temperature surface therein according to the invention.
Figure 3A:
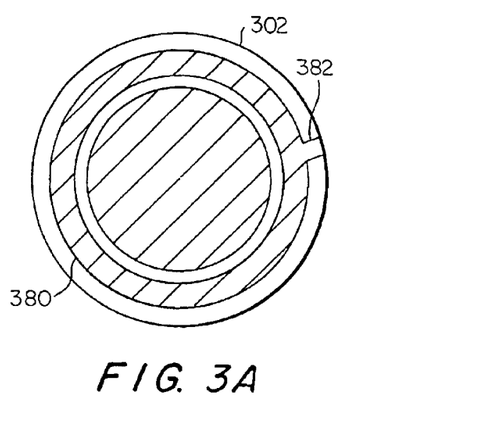
FIG. 3A illustrates a plan view of the high-temperature surface of FIG. 3 taken through line 3A—3A of FIG. 3.

FIG. 3 illustrates a cross-section of a reactor 300 in accordance with the invention. Closely surrounding heater 340 and preferably slightly below heater surface 342 is heat ring 380. Ring 380 is made of a material or materials that can be heated to a temperature high enough to destroy the active species of pre-cursor gases used in ALD processes. Ring 380 can be, for example, ceramic or Inconel. Heat ring 380 preferably has a flat circular surface and may be supported and connected to reactor wall 302 by support 382.

Figure 4:
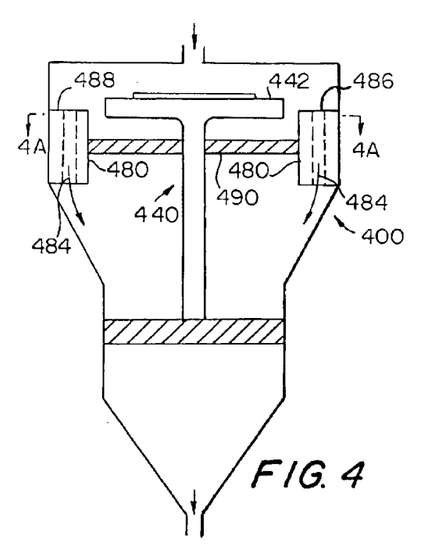
FIG. 4 illustrates a cross-section of a reactor with a third embodiment of a high-temperature surface therein according to the invention.

FIG. 4 shows another embodiment of a high-temperature surface inside a reactor according to the invention. High-temperature surface 480 is a heated pumping ring with pumping ports (e.g., passageways or ducts). Pumping ring 480 is heated to a temperature high enough to destroy the active species of a pre-cursor gas used in ALD processes. Gases are pulled through openings 486 of pumping ports 484 located on top surface 488 of pumping ring 480. Top surface 488 is preferably even with or below surface 442 of heater 440. Pumping ring 480 may be similar to pumping rings available from Applied Materials, of Santa Clara, Calif. Barrier 490 preferably prevents gas from flowing past surface 442 to the output of reactor 400 without passing through openings 486 of pumping ring 480.

Figure 4A:
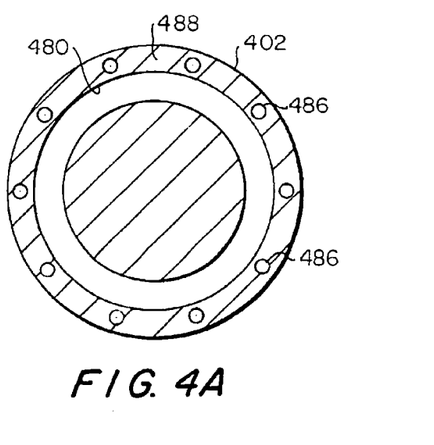
FIG. 4A illustrates a plan view of the high-temperature surface of FIG. 4 taken through line 4A—4A of FIG. 4.

FIG. 4A shows openings 486 on top surface 488 of ring 480 to pumping ports 484 (not shown in FIG. 4A). Some of the gas entering reactor 400 is pulled through pumping ports 484 by a pressure differential. This pressure differential may be created by a vacuum or other type of pump (not shown) connected to pumping ports 484. Pumping ring 480 may be connected to reactor wall 402 or supported by a support (not shown).

Figure 5:
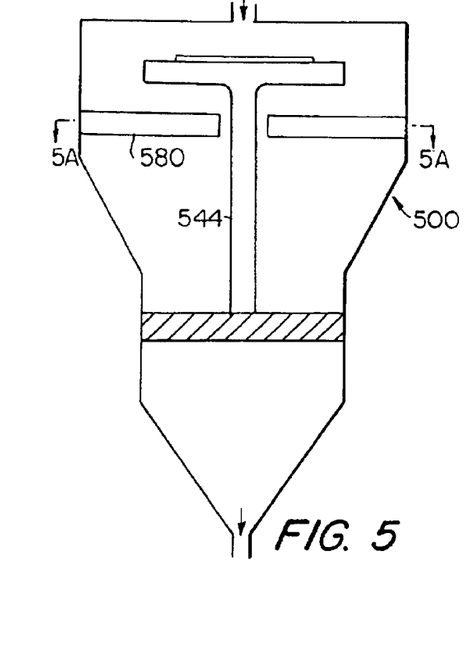
FIG. 5 illustrates a cross-section of a reactor with a fourth embodiment of a high-temperature surface therein according to the invention.

FIG. 5 illustrates a reactor 500 with a high-temperature surface 580 according to the invention. Surface 580 is a perforated plate and preferably has a substantially circular opening in the middle of the plate with a diameter slightly larger than the diameter of heater column 544. Surface 580 is preferably placed inside reactor 500 such that surface 580 and heater column 544 are not in contact. Surface 580 is heated to a temperature high enough to destroy the active species of a pre-cursor gas used in ALD processes.

Figure 5A:
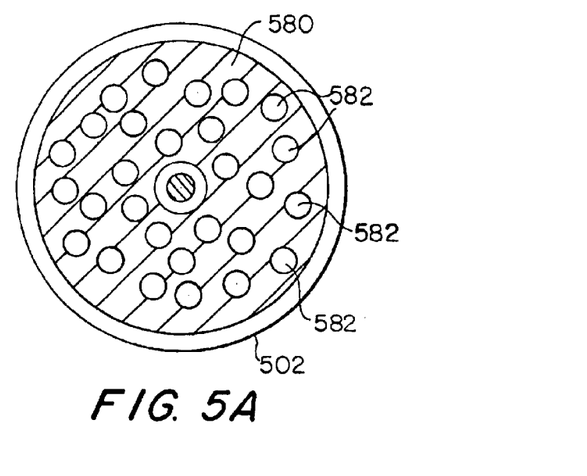
FIG. 5A illustrates a plan view of the high-temperature surface of FIG. 5 taken through line 5A—5A of FIG. 5.

FIG. 5A shows several openings 582 in surface 580. Openings 582 may be small or large depending on the number of openings 582. The size and number of openings 582 should be such that they do not substantially hinder gases from passing through reactor 500, yet provide enough surface area of surface 580 to ensure that active species are destroyed. The outer diameter of surface 580 may be the same as the inner diameter of reactor wall 502. Alternatively, the outer diameter of surface 580 may be less than the diameter of reactor wall 502 and may be supported by a support extending from wall 502 (not shown).

Figure 6:
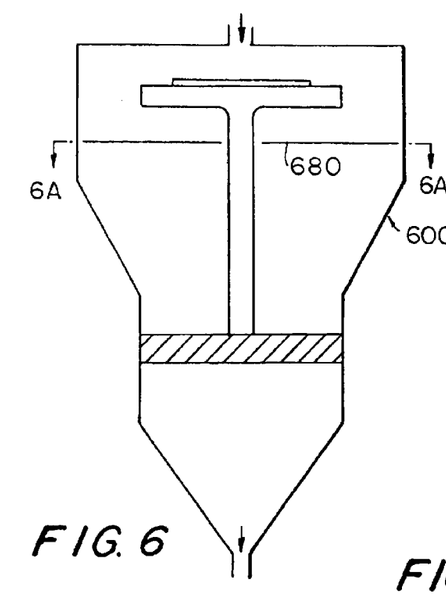
FIG. 6 illustrates a cross-section of a reactor with a fifth embodiment of a high-temperature surface therein according to the invention.
Figure 6A:
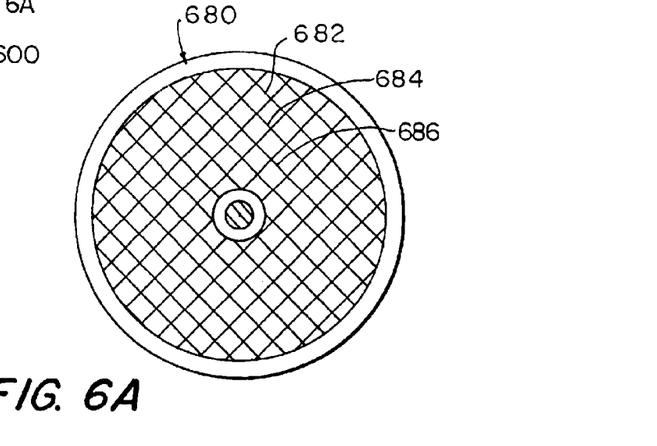
FIG. 6A illustrates a plan view of the high-temperature surface of FIG. 6 taken through line 6A—6A of FIG. 6.

FIG. 6 illustrates another high-temperature surface inside a reactor 600 in accordance with the invention. Surface 680 includes a preferably ordered mesh (better seen in FIG. 6A) of material or materials that can be heated to a temperature high enough to destroy the active species of pre-cursor gases used in ALD processes. Such materials may be, for example, ceramics or Inconel. As illustrated in FIG. 6A, exemplary mesh portions 682, 684, and 686 of surface 680 are ordered.

Figure 7:
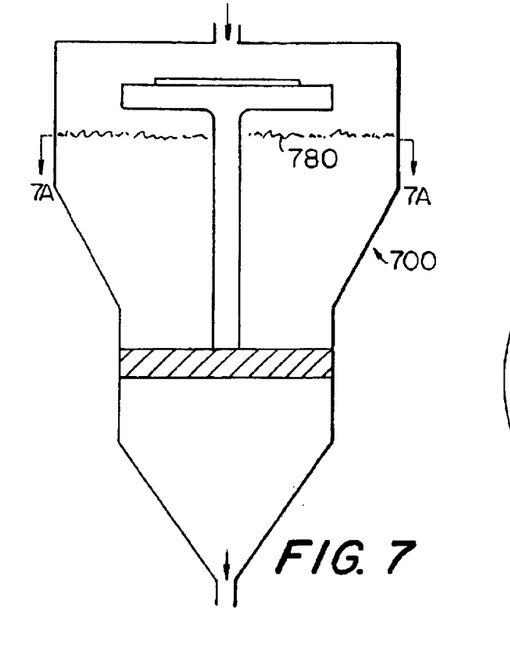
FIG. 7 illustrates a cross-section of a reactor with a sixth embodiment of a high-temperature surface therein according to the invention.
Figure 7A:
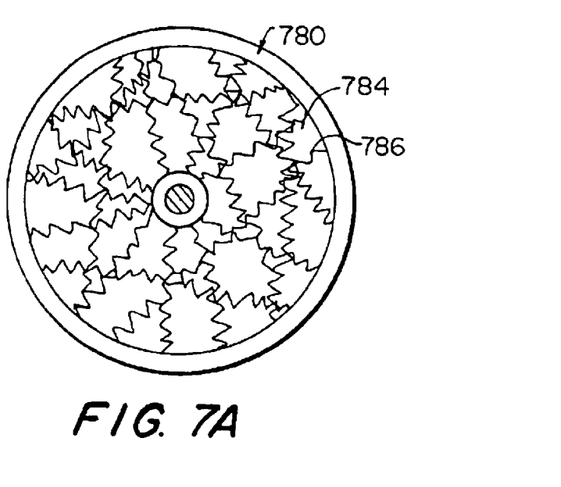
FIG. 7A illustrates a plan view of the high-temperature surface of FIG. 7 taken through line 7A—7A of FIG. 7.

FIG. 7 illustrates a high-temperature surface 780 similar to surface 680. Surface 780 is also a mesh of a material or materials that can be heated to a temperature high enough to destroy the active species of pre-cursor gases used in ALD processes. However, as shown in FIG. 7A, mesh 780 is a random arrangement of metal, other material, or combination thereof. Exemplary mesh portions 784 and 786, for example, are shown to be randomly arranged in mesh 780.

Figure 8:
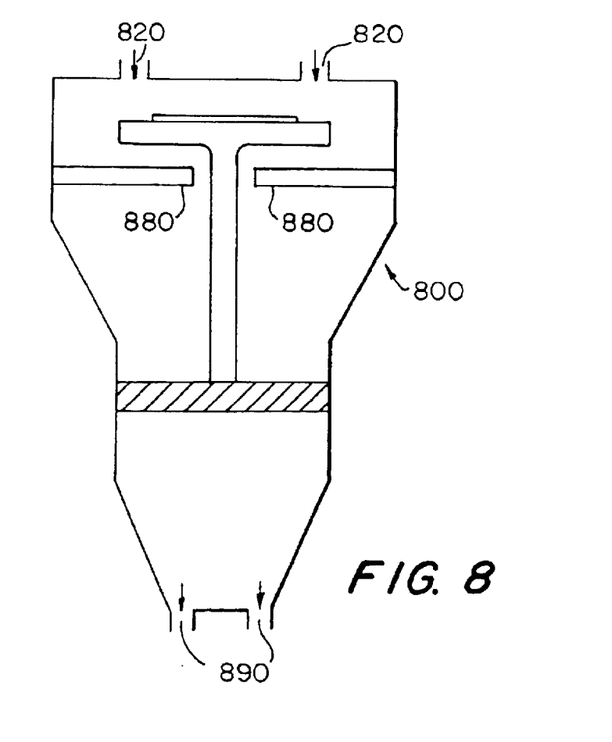
FIG. 8 illustrates a reactor with more than one gas input and gas output according to the invention.

The reactors of FIGS. 1–7 are shown with one gas input and one gas output for illustrative purposes only. Other numbers of gas inputs and gas outputs may be used. Reactor 800 of FIG. 8, for example, has two gas inputs 820 and two gas outputs 890. Gas may be selectively input into reactor 800 via gas inputs 820 by operating valves (not shown) that control the flow of gas through gas lines connected to gas inputs 820. Gas exits reactor 800 via gas outputs 890. Similarly, gas outputs 890 may be coupled to valves (not shown) that control the flow of gas through gas lines connected to gas outputs 890. Preferably, gas lines connected to the gas outputs are connected to pumps (not shown) to increase the throughput of gas through reactor 800. Inside reactor 800 is surface 880. Surface 880 is heated to a temperature high enough to destroy the active species of pre-cursor gases used in ALD processes.

Furthermore, although the embodiments of FIGS. 1–7 are shown with one heating surface and one substrate, again for illustrative purposes only, other numbers of heating surfaces and substrates may be used in accordance with the invention.

Figure 9:
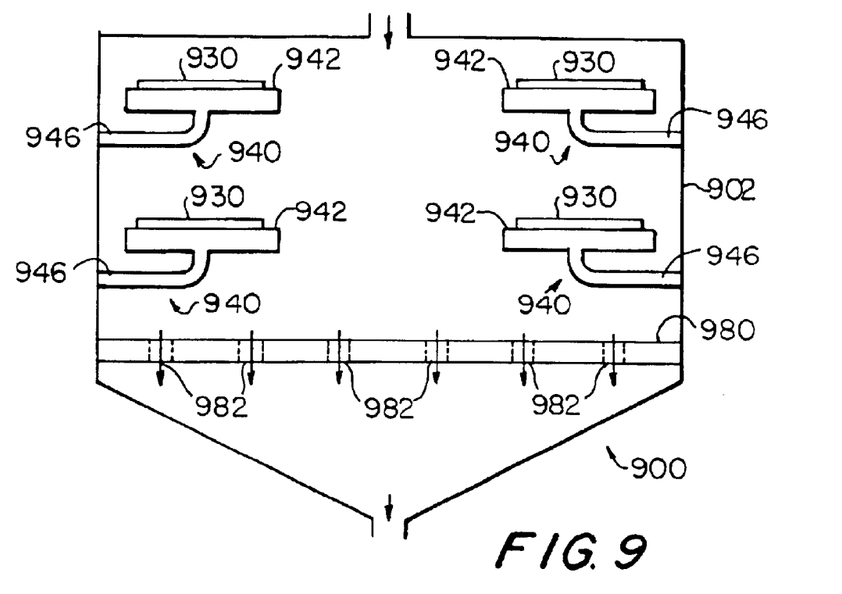
FIG. 9 illustrates a reactor with multiple substrates therein according to the invention.

For example, FIG. 9 illustrates a cross-section of reactor 900. Reactor 900 has multiple heaters 940 that have multiple heating surfaces 942. Heaters 940 may be supported by heater supports 946, which are fixed to reactor wall 902. Alternatively, heaters 940 may be supported in other suitable ways such that substrates 930 placed on respective heating surfaces 942 may have thin films grown on them. In addition, a vacuum may be used to hold substrates 930 to respective heating surfaces 942 during the ALD. The surface of a substrate 930 on which a film is to be grown does not have to be level and can be oriented in any direction (however, the surface of substrate 930 on which a film is to be grown should not face down on heater surface 942).

Inside reactor 900 is high temperature surface 980, which is a perforated plate with openings 982. Surface 980 is heated to a temperature high enough to destroy the active species of pre-cursor gases used in ALD processes.

Figure 10:
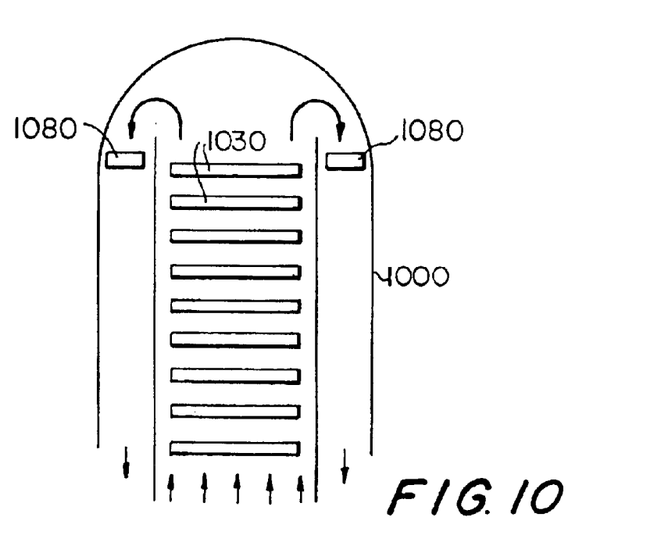
FIG. 10 illustrates another reactor with multiple substrates therein according to the invention.

FIG. 10 illustrates a cross-section of reactor 1000. As shown, thin films may be grown on multiple substrates 1030, which are each on or near a heater (not shown). After gas passes substrates 1030, the gas passes over and through high-temperature surface 1080, which can be any one of surfaces 280, 380, 480, 580, 680, 780, 880, or 980. The gas exits reactor 1000 on the same side as it enters reactor 1000.

Figure 11:
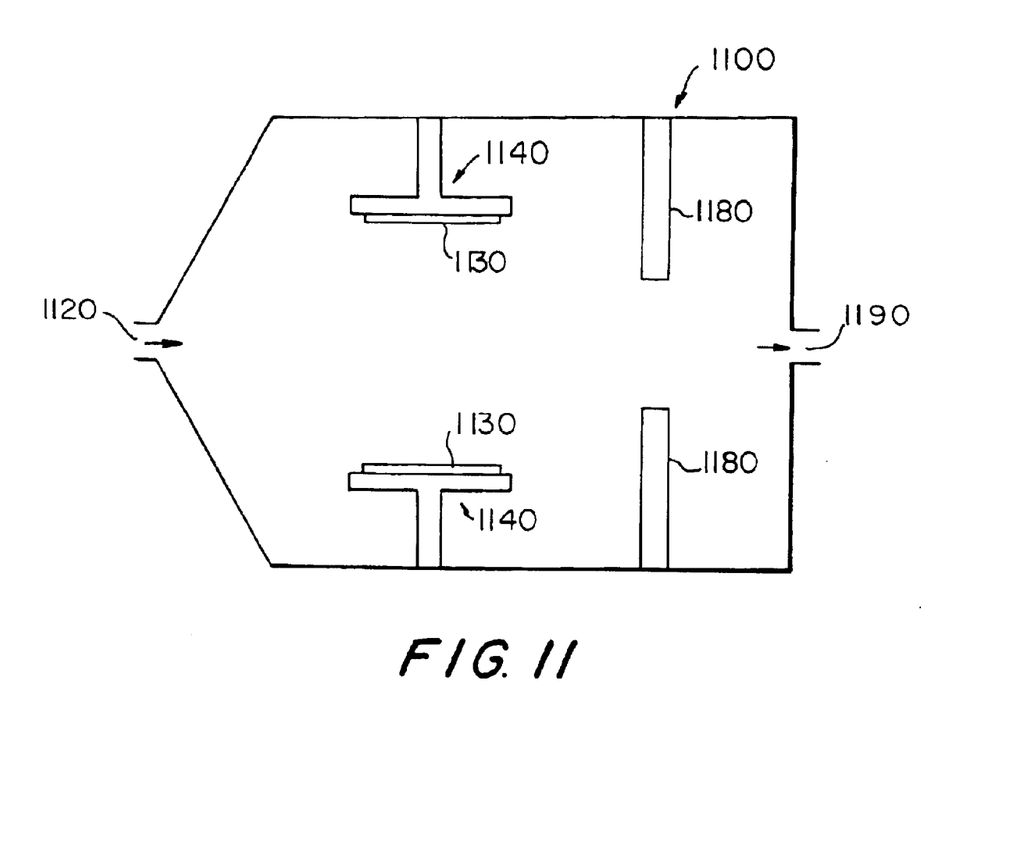
FIG. 11 illustrates a reactor in which the flow of gas is horizontal according to the invention.

FIG. 11 shows a cross-section of reactor 1100, which is arranged such that the flow of gas from gas input 1120 to gas output 1190 is horizontal. The direction of gas flow is not important provided that the number of atoms deposited on a substrate is substantially uniform across the substrate and that the amount of atoms deposited on each subsequent monolayer is also substantially uniform.

Inside reactor 1100 are two substrates 1130 fixed to two respective heating surfaces 1140. Substrates 1130 may be held to heaters 1140 by, for example, vacuum. The surface of each substrate 1130 on which a film is to be grown preferably faces the center of reactor 1100. This ensures that substantially uniform monolayers of atoms are deposited on the substrate. A high-temperature surface 1180 is downstream (with respect to the flow of gas) from substrates 1130 and heaters 1140. Surface 1180 is heated to a temperature high enough to destroy the active species of pre-cursor gases used in ALD processes.

Figure 12:
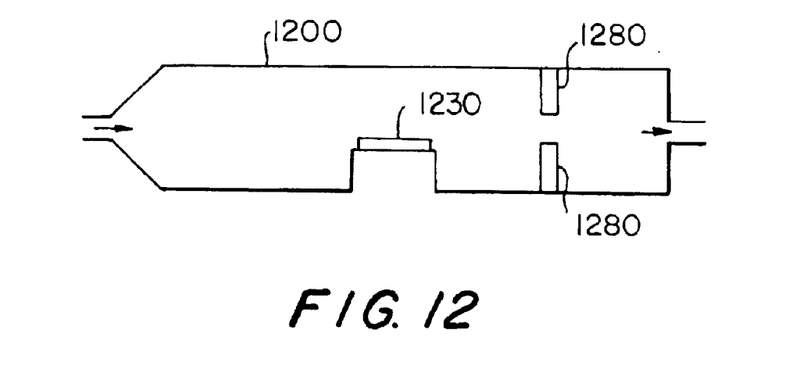
FIG. 12 illustrates another reactor in which the flow of gas is horizontal according to the invention.

FIG. 12 illustrates a cross-section of reactor 1200 in which the flow of gas over substrate 1230 is again horizontal. High-temperature surfaces 1280 are downstream (with respect to the flow of gas) from substrate 1230. Surfaces 1280 are heated to a temperature high enough to destroy the active species of pre-cursor gases used in ALD processes.

The reactors of the invention can be of any type suitable for ALD including depression reactors and barrel reactors.

High-temperature surfaces such as surfaces 280, 380, 480, 580, 680, 780, 980, 1080, 1180, and 1280 may be heated by, for example, an electrical power source external to the reactor in which the surface is located. High-temperature surfaces may also be heated by, for example, heat convection.

Figure 13:
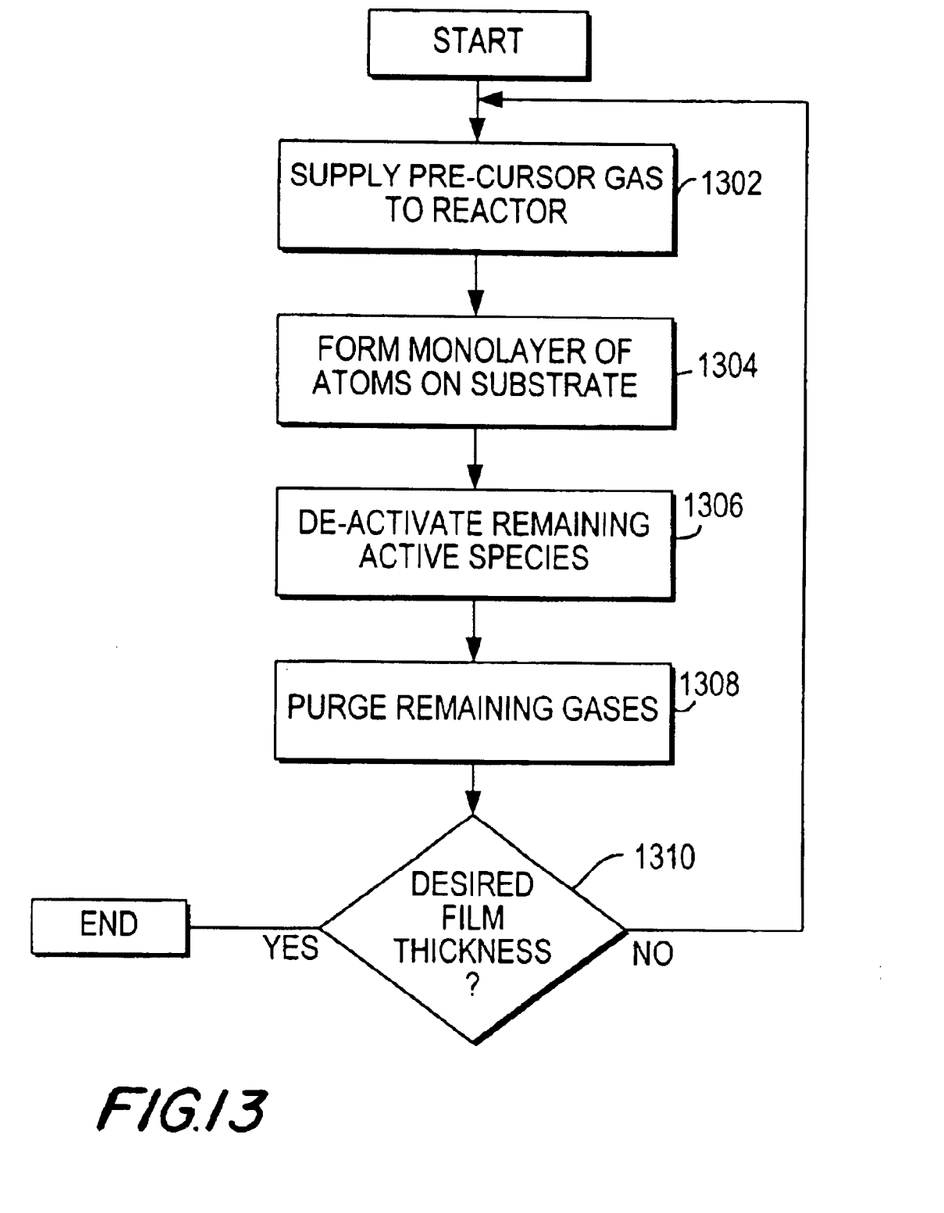
FIG. 13 is a flow chart of a process for growing thin films according to the invention.

FIG. 13 shows an ALD process in accordance with the invention. At 1302, a pre-cursor gas enters a reactor. At 1304, the active species of the pre-cursor gas react with a substrate resulting in a monolayer of atoms on the substrate. The active species are substantially de-activated at 1306 when they come in the vicinity of, or into contact with, one or more high-temperature surfaces, such as surface 280, 380, 480, 580, 680, 780, 980, 1080, 1180, or 1280, inside the reactor. The remaining gases are purged from the reactor at 1308. If the desired thin film thickness has not yet been grown, then at 1310, the process returns to 1302.

The above embodiments destroy active species of pre-cursor gases insitu by subjecting them to a high-temperature surface in the same reactor in which the ALD process occurs. In those ALD processes in which active species of pre-cursor gases can be destroyed by subjecting them to a cold-temperature surface, a cold-temperature surface may be alternatively placed inside the reactor. The cold-temperature surface may be the same shape as any of high-temperature surfaces 280, 380, 480, 580, 680, 780, 980, 1080, 1180, or 1280. The cold-temperature surface can be at any temperature below the reaction temperature of the ALD process that induces rapid decay of active species. For example, the cold-temperature surface can be about 100° C., room temperature, freezing, or below freezing, depending on the active species to be destroyed.

Note that although semiconductor substrates have been described herein with respect to ALD, the invention is not limited to them. Other workpieces appropriate for ALD are also within the scope of the invention.

In addition, although the ALD processes described herein have been described using only two pre-cursor gases, the invention is not limited to two pre-cursor gases. For example, three or four pre-cursor gases may be used.

Thus it is seen that systems and methods of insitu post atomic layer deposition destruction of active species are provided. One skilled in the art will appreciate that the invention can be practiced by other than the described embodiments, which are presented for purposes of illustration and not of limitation, and the invention is limited only by the claims which follow.

We claim:

1. A method of atomic layer deposition, the method comprising:
   heating at least one workpiece in a reactor to a temperature suitable for atomic layer deposition;
   introducing a gas into the reactor;
   heating a surface in the reactor to a temperature high enough to substantially destroy the portion of the gas that does not react with the workpiece, the surface coated with catalyst that increases the rate of destruction of the portion of the gas that does not react with the workpiece;
   subjecting the non-reacted portion to the heated surface; and
   purging the gas from the reactor.

2. The method of claim 1 wherein the workpiece is a semiconductor substrate.

3. The method of claim 1 wherein the heating comprises heating the surface to a temperature high enough to cause the portion of the gas that does not react with the workpiece to substantially decay into a non-active species.

4. The method of claim 1 wherein the surface is coated with MnO, $MnO_2$, or CuO.

5. The method of claim 1 wherein the surface is heated to a temperature greater than about 200° C. and less than about 300° C.

6. The method of claim 1 wherein the surface is heated to a temperature greater than about 300° C. and less than about 400° C.

7. The method of claim 1 wherein the surface is heated to a temperature greater than about 400° C.

8. The method of claim 1 wherein the subjecting comprises forcing gases to flow from the heating of the workpiece to the heated surface.

9. The method of claim 1 wherein the surface is selected from the group consisting of a ring, a mesh, a perforated plate, a fin, and any combination thereof.

10. The method of claim 9 wherein the ring includes passageways through which gas can pass.

11. The method of claim 10 wherein vacuum is pulled through at least one of the passageways.

12. A method of atomic layer deposition, the method comprising:
heating a workpiece to a first temperature inside a reactor;
introducing a gas into the reactor for atomic layer deposition;
heating a structure inside the reactor to a second temperature, the structure coated with a catalyst that increases the rate of destruction of at least a portion of the gas;
creating a gas flow from the workpiece to the structure; and
purging the gas from the reactor.

13. The method of claim 12 wherein the first temperature causes at least a portion of the gas to react with the workpiece.

14. The method of claim 12 wherein the second temperature is high enough to substantially destroy that portion of the gas that does not react with the workpiece.

15. The method of claim 12 wherein the first temperature is lower than the second temperature.

16. The method of the claim 12 wherein the first temperature is higher than the second temperature.

17. A method of atomic layer deposition, the method comprising:
heating a first area inside an enclosure to about 200° C.;
heating a second area inside the enclosure concurrently to about 400° C., wherein the second area includes a surface coated with a catalyst that increases the rate of destruction of a portion of a gas; and
creating a gas flow from the first area to the second area.

18. The method of claim 17 further comprising:
providing a gas to the first area; and
purging gas from the second area.

19. The method of claim 18 wherein the gas comprises ozone.

20. The method of claim 17 further comprising placing a semiconductor substrate in the first area.

21. A method of atomic layer deposition, the method comprising:
heating a first area inside an enclosure to a first temperature;
heating a structure in a second area inside the enclosure concurrently to heating the first area to a second temperature, the structure coated a catalyst that increases the rate of destruction of at least a portion of a gas that does not react with a workpiece;
placing the workpiece in the first area;
providing a gas to the first area;
creating a gas flow from the first area to the second area; and
purging the gas from the second area.

* * * * *